United States Patent [19]

Kondoh et al.

[11] Patent Number: 5,552,181
[45] Date of Patent: Sep. 3, 1996

[54] METHOD FOR SUPPLYING LIQUID MATERIAL AND PROCESS FOR FORMING THIN FILMS USING THE LIQUID MATERIAL SUPPLYING METHOD

[75] Inventors: Eiichi Kondoh; Toru Mitomo; Hiroshi Yamamoto; Tomohiro Ohta, all of Chiba, Japan

[73] Assignee: Kawasaki Steel Corporation, Hyogo, Japan

[21] Appl. No.: 170,789

[22] Filed: Dec. 21, 1993

[30] Foreign Application Priority Data

Dec. 21, 1992 [JP] Japan ..................... 4-340088
Mar. 26, 1993 [JP] Japan ..................... 5-068261

[51] Int. Cl.⁶ ............................................. C23C 16/00
[52] U.S. Cl. .................. 427/248.1; 427/250; 427/255.1; 118/715
[58] Field of Search ............... 427/166, 248.1, 427/250, 255, 255.1; 118/715

[56] References Cited

U.S. PATENT DOCUMENTS

| | | | |
|---|---|---|---|
| 4,235,829 | 11/1980 | Partus | 261/121 R |
| 4,310,474 | 1/1982 | Iyengar | 261/1 |
| 4,436,674 | 3/1984 | McMenamin | 261/64 B |
| 4,517,220 | 5/1985 | Rose | 427/8 |
| 4,582,480 | 4/1986 | Lynch et al. | 432/1 |
| 4,671,097 | 6/1987 | Kurki et al. | 73/3 |
| 4,734,514 | 3/1988 | Melas et al. | 556/70 |
| 4,783,343 | 11/1988 | Sato | 427/8 |
| 4,911,101 | 3/1990 | Ballingall, III et al. | |
| 4,919,304 | 4/1990 | Markowicz | 222/3 |
| 5,130,459 | 7/1992 | Shinzawa | 556/178 |
| 5,147,688 | 9/1992 | Melas | 427/255.3 |
| 5,151,305 | 9/1992 | Matsumoto et al. | 427/252 |

FOREIGN PATENT DOCUMENTS

| | | |
|---|---|---|
| 4-7847 | 1/1992 | Japan . |
| 4-14827 | 1/1992 | Japan . |

OTHER PUBLICATIONS

R. Bhat et al., "The Growth And Characterization of AlGaAs Using Dimethyl Aluminum Hydride", Journal of Crystal Growth, vol. 77, 1986, pp. 7–10.

Gazicki et al., "Precise measurement of flow rates of vaporized tetraethylgermanium carried by an inert gas", J. Vacuum Science and Technology, vol. A 10(1), Jan./Feb. 1992, pp. 51–57.

Kumar et al., "The Formation of Bubbles and Drops", Advances in Chemical Engineering, edited by Drew et al., Academic Press, 1970, pp. 255–257, 289–305.

Primary Examiner—Shrive Beck
Assistant Examiner—Brian K. Talbot
Attorney, Agent, or Firm—Oliff & Berridge

[57] ABSTRACT

A method of supplying, in a gaseous phase, a material which is in a viscous liquid phase at normal temperature. The viscous liquid material is provided in a bubbler and the pressure of the vessel is maintained below atmospheric pressure. A carrier gas is supplied through a nozzle opening in the liquid material inside the vessel. The carrier gas is temporarily dissolved in the liquid and then released to form fine bubbles into which the liquid material is vaporized, so that the vapor of the material is supplied together with the carrier gas.

16 Claims, 5 Drawing Sheets

$Q = 1000 \, cc/min$
$P_b = 190 \, torr$

METHOD FOR SUPPLYING LIQUID MATERIAL AND PROCESS FOR FORMING THIN FILMS USING THE LIQUID MATERIAL SUPPLYING METHOD

BACKGROUND OF THE INVENTION

1. Field of the Invention

This invention is drawn to a method for vaporizing a viscous material and introducing the material vapor into a CVD reaction apparatus. This invention is also drawn to a process for forming a thin film on a substrate by using the material vaporizing method.

2. Description of the Related Art

Methods for forming thin films incorporating CVD (Chemical Vapor Deposition) techniques are significant in current semiconductor production. Forming thin films using CVD methods sometimes requires the use of a material which is in its liquid phase at normal or room temperature. Typical examples of such materials are: trimethylgallium (TMG), which is used as a source of Ga material in the production of GaAs thin films as a semiconductor compound, and trimethylalumminum (TMA) and dimethylaluminumhydride (DMAH), which are used as sources of Al material in the production of AlGaAs thin films or in the formation of Al thin films which are used as a metal conductor wiring in a semiconductor device.

In order to introduce this kind of liquid material into a CVD reaction vessel, a method has been proposed and used. In this known method, the liquid material is charged in a bubbler. A carrier gas is supplied through a nozzle immersed in the liquid inside the bubbler at a constant rate under the control of a mass-flow controller. This generates bubbles of the carrier gas in the liquid material. The carrier gas bubbles ascend through the liquid while allowing the liquid material to be vaporized into and become mixed with the carrier gas. The material gas thus obtained is introduced into the reaction vessel together with the carrier gas.

An Al-CVD process which uses, for instance, DMAH, uses $H_2$ gas as the carrier gas, as disclosed in, for example, R. Bhat et al., J. Crystal Growth, vol. 77 pp. 77 (1986).

In this known process, the rate of supply of the carrier gas is on the order of 100 sccm (standard cubic centimeter per minute). In general, mass-production of semiconductors requires the supply of the material at a larger rate. Prior to this invention, however, no practical method has been proposed or used which would realize the required high supply rate when using a highly viscous material. This also makes it difficult to form, at a high speed, a thin film on a semiconductor substrate having a substantial area.

Japanese Patent Laid-Open No. 4-7847 discloses a method in which the pressure at the supply line for the carrier gas is reduced to below the atmospheric pressure, while Japanese Patent Laid-Open No. 4-14827 discloses a method in which a pressure buffering function is provided to act between the vaporizing portion and a reaction vessel. These known methods, however, are intended to achieve a high degree of precision in the material flow rate control, but are not intended to achieve a supply of a highly viscous material at a large rate.

SUMMARY OF THE INVENTION

It is an object of the present invention to provide an improved method for supplying a highly viscous material. In particular, this invention provides a generally applicable method in which a highly viscous material is dissolved at a high concentration in a carrier gas and is conveyed into a reaction vessel at a large flow rate.

It is another object of the present invention to provide a carrier gas which is suitable for dissolving such a highly viscous material.

It is a further object of the present invention to provide conditions suitable for dissolving a highly viscous material into a carrier gas.

It is also an object of the present invention to provide a process for forming, by using CVD method, a thin film on the surface of a substrate.

To these ends, according to the present invention, a method is provided for supplying a viscous liquid material, comprising the steps of: charging the liquid material in a bubbler; and supplying a carrier gas into the bubbler through at least one nozzle immersed in the liquid material, while maintaining the pressure within the bubbler at a level not higher than the atmospheric pressure; whereby the carrier gas is temporarily dissolved in the liquid material and then released to form fine bubbles in the liquid material.

In one form of the invention, DMAH is used as the liquid material, and the pressure within the bubbler and the carrier gas flow rate per nozzle are determined in relation to each other so as to meet specific conditions.

According to another aspect of the present invention, a process is provided for forming a thin film on a substrate by chemical vapor deposition (CVD), comprising the steps of: charging a viscous liquid material in a bubbler; supplying a carrier gas into the bubbler through at least one nozzle immersed in the liquid material, while maintaining the pressure within the bubbler at a level not higher than the atmospheric pressure, thereby causing the carrier gas to be temporarily dissolved into the liquid material and then released to form fine bubbles in the liquid material, thus also vaporizing the liquid material; and introducing the vapor of the material together with the carrier gas into a CVD reaction vessel where the substrate is placed.

The above and other objects, features and advantages of the present invention will become clear from the flowing detailed description of the invention and preferred embodiment and statements in the appended claims.

DETAILED DESCRIPTION OF THE INVENTION

The basic principles of the present invention will be described first, followed by description of embodiments or practical forms of the invention.

(1) Principles of Operation

It is assumed here that a carrier gas is blown into a highly viscous liquid material to generate bubbles, so that the material is conveyed together with the carrier gas. It is also assumed that a number of bubbles "n", each having a volume "v", in cubic centimeters (cc), are generated per unit time "t", in seconds. In such a case, the volumetric flow rate Q of the carrier gas is given by the following equation (1):

$$Q = \frac{vn}{t} \quad (1)$$

The relationship between the volumetric flow rate and the standard flow rate Q', in standard cubic centimeters per second, (referred to simply as "flow rate" hereinafter) converted into standard state is expressed by equation (2):

$$Q' = Q \cdot 760/P \quad (2)$$

where P, in torr, represents the pressure in the vaporizing atmosphere, i.e., the pressure inside the bubble.

Assuming also that the material is dissolved into the carrier gas bubbles at a vapor pressure $P_g$, also in torr, the flow rate F, in moles per second of the vaporized material, is given by equation (3):

$$F = QP_g/RT = 760 \, Q'P_g/PRT \quad (3)$$

where R represents the gas constant.

As will be understood from this equation, the flow rate F of the vaporized material is proportional to the volumetric flow rate Q of the carrier gas or to Q'/P, provided that the vapor pressure $P_g$ is constant. When the viscosity of the material is low while the flow rate of the carrier gas is small, the vaporizing atmosphere pressure P is substantially equal to the pressure Pb within the bubbler.

Therefore, increasing the carrier gas flow rate Q and reducing the pressure within the bubbler produces almost identical effects on the increase of the flow rate of the material.

The total surface areas S, in square centimeters, of the bubbles is expressed by equation (4):

$$S = sn = sQ/v = 4.836 \, v^{2/3}Q/v = 4.836 \, v^{-1/3}Q \quad (4)$$

where s is the average surface area of the individual bubbles.

Thus, the total bubble surface area decreases as the bubble diameter increases, specifically in inverse proportion to a ⅓ power of the bubble diameter. According to kinetics of vaporization, the rate of vaporization varies in proportion to the area of the gas-liquid interface, i.e., the bubble surface area, so that the rate of vaporization or the flow rate of the material decreases when the bubble diameter increases.

When the viscosity of the liquid material is low, the gas-liquid interface tension serves as a dominant factor on the bubble diameter. That is to say, the bubble diameter does not change even when the flow rate of the carrier gas is changed. In this case, the rate of vaporization of the material increases in accordance with the increase in the volumetric flow rate of the carrier gas. In fact, Gazicki et al., J. Vacuum Science & Technology A10(1), pp. 51–58 (1992) for example discloses that increasing the carrier gas flow rate and decreasing the pressure within the bubbler are effective measures for increasing the flow rate of the material, when the viscosity of the material is low.

In contrast, drag force for formation of bubbles is dominant when the liquid material has a high viscosity. For instance, Advances in Chemical Engineering, Vol. 8 (Academic press, N.Y., 1970) pp. 300, discloses that the bubble diameter increases in accordance with increase in the carrier gas flow rate when the liquid material has a high viscosity, exceeding 100 cp.

Therefore, when the material has a high viscosity, any attempt to increase the volumetric flow rate Q of the carrier gas does not cause the material gas flow rate to increase to the extent expected from Eq. (3). That is, the vaporization efficiency decreases due to the decrease in the vapor pressure $P_g$. DMAH, for instance, exhibits a very high viscosity of 4000 cp or so at room temperature. Therefore, an increase in the carrier gas blowing rate alone merely increases the bubble size and, rather, serves to reduce the vaporization efficiency.

According to this invention, liquid material of high viscosity is provided in a bubbler and, while the pressure within the bubbler is maintained below atmospheric pressure, a carrier gas is introduced through a nozzle immersed in the liquid material so that the carrier gas immediately dissolves into the liquid material. The dissolved carrier gas then comes out of solution (i.e. it is released by the liquid material) to form tiny or fine bubbles in the liquid material.

According to this method, a large total bubble surface area is maintained, thus suppressing the reduction in the vaporization efficiency, even when the volumetric flow rate of the carrier gas is increased and the liquid material has a high viscosity.

(2) Practical measure

Dissolving the carrier gas in the liquid material and the subsequent generation of the fine bubbles of the carrier gas within the liquid material are effectively realized under the following conditions:

(1) Selection of combination of a carrier gas and a liquid material which can easily absorb the carrier gas (2) Reduction of the pressure within the bubbler; and (3) Increase in the volumetric flow rate of the carrier gas As to condition (1), the inventors have found that the combination of DMAH and hydrogen is optimumly used.

The 2 pz orbital of Al in the DMAH molecule is vacant and therefore electrophilic. On the other hand, H bonded to Al is nucleophilic because of small electronegativity of Al. Consequently, the DMAH molecules are mutually intermolecular-bonded to associate in a polymeric manner. This bond, however, is not so strong as that in ordinary chemical bonding, so that gaps exist between the molecules. It is considered that dissolution of large quantities of the carrier gas owes to the presence of the inter-molecular gaps. On the other hand, $H_2$ gas, having small molecules, is effectively used as the carrier gas to be dissolved. Helium can suitably be used as a carrier gas in place of A discussion will now be given on conditions (2) and (3).

As stated above, the resistance of the liquid material to bubble formation is not negligible when the liquid material has a high viscosity. Thus, formation of bubbles of the gas blown through the nozzle essentially requires that the blowing pressure is high enough to overcome the resistance posed by the liquid material.

A relationship expressed by the following equation, Eq. (5), exists between the resistance RD, in dynes, posed by the liquid and the linear velocity, "u", in centimeters per second (CM/S), of the carrier gas.

$$R_D \propto u^2 \quad (5)$$

In the beginning period of the blowing operation, a relationship expressed by the following equation, Eq. (6), exists between the above-mentioned linear velocity and the volumetric flow rate of the carrier gas:

$$u \propto Q \qquad (6)$$

Consequently, the pressure inside the bubble during blowing is greater than the internal pressure of the bubbler by an amount, ΔP, in torr, which is expressed by the following equation:

$$\Delta P = \frac{R_D}{S} \propto Q^2 \qquad (7)$$

It is thus possible to obtain a blowing pressure higher than the internal pressure of the bubbler by increasing the volumetric flow rate of the carrier gas. This pressure differential effectively serves to increase the amount of the carrier gas dissolved into the liquid material.

The bubble performs the following thermodynamical work W on the liquid material while ascending through the liquid material.

$$W = \int_{P_2}^{P_1} V dp = \int_{P_2}^{P_1} (n'T/P) dp \propto \log(P_1/P_2) \qquad (8)$$

The suffixes "1" and "2" indicate vertical positions in a gravity field. Specifically, position $P_1$ indicates nozzle outlet, while position $P_2$ indicates the surface of the liquid.

Thus, the thermodynamical work W is expressed by the following equation:

$$W \propto \log\{(P_b + \Delta P) P_b\} \qquad (9)$$

It is thus clear that increasing the volumetric flow rate of the carrier gas to increase the pressure difference AP and reducing the pressure within the bubbler lead to large work on the liquid, i.e., strong agitation of the liquid.

Enhancement in the agitation increases the number of fine bubbles which are generated by cavitation. Another expected effect is that the carrier gas in coarse bubbles dissolves into the liquid, thus reducing the size of the coarse bubbles.

(3) Setting of practical condition through experiment

A description will now be given of the conditions under which the liquid material supplying method of this invention is optimumly carried out, through illustration of results of a number of experiments.

Experiment 1

Figure 1:
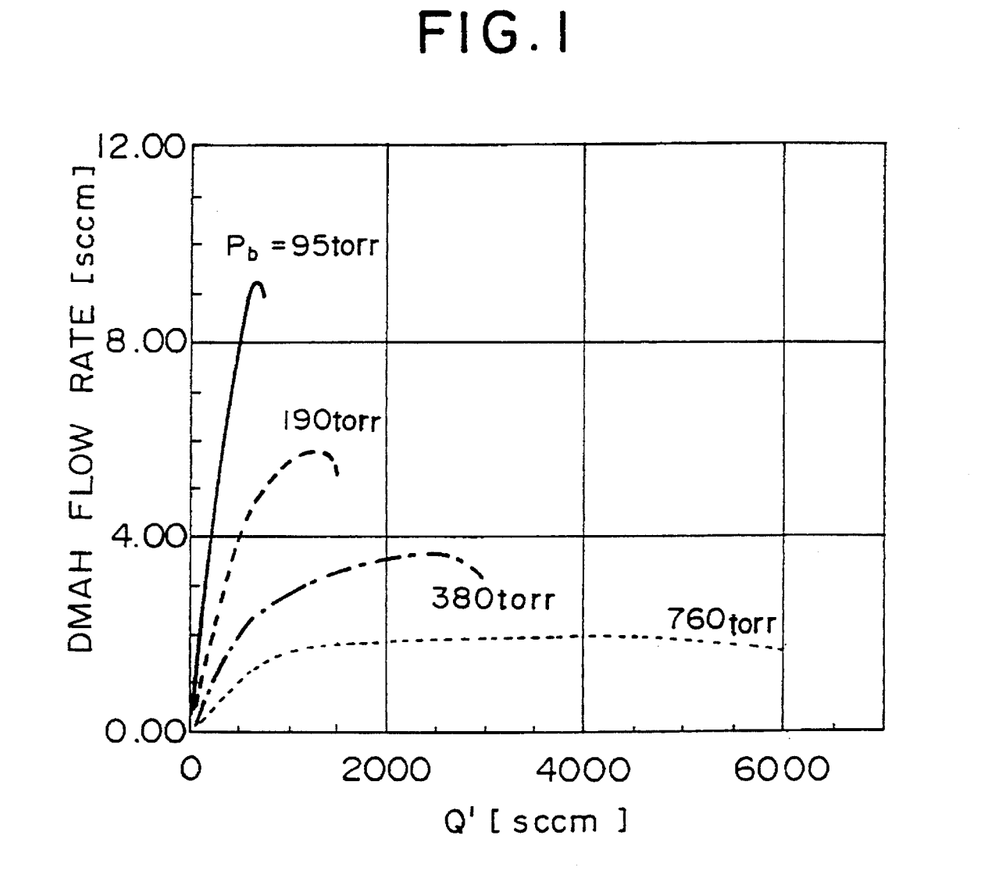
FIG. 1 is a graph showing the relationship between the flow rate Q' of $H_2$ as a carrier gas (in standard cubic centimeter per minute) and the flow rate of DMAH as a material gas when the carrier gas is blown into the material at various pressures.

FIG. 1 represents the relationship between the flow rate of $H_2$ as the carrier gas and the flow rate of DMAH when the $H_2$ gas is blown into DMAH in a bubbler. When the pressure within the bubbler is 760 tort (atmospheric pressure),and the temperature is 22° C., the DMAH flow rate increases substantially in proportion to the carrier gas flow rate until the carrier gas flow rate reaches 700 sccm. However, the DMAH flow rate saturates at 2.0 sccm when the carrier gas flow rate is increased beyond 700 sccm. Thus, the DMAH flow rate is at most 2.0 sccm.

However, the maximum DMAH flow rate was increased to 3.7 sccm, 5.8 sccm and 9.2 sccm, respectively, when the internal pressure within the bubbler was reduced to 380 torr, to 190 torr, and to 95 torr.

Figure 2:
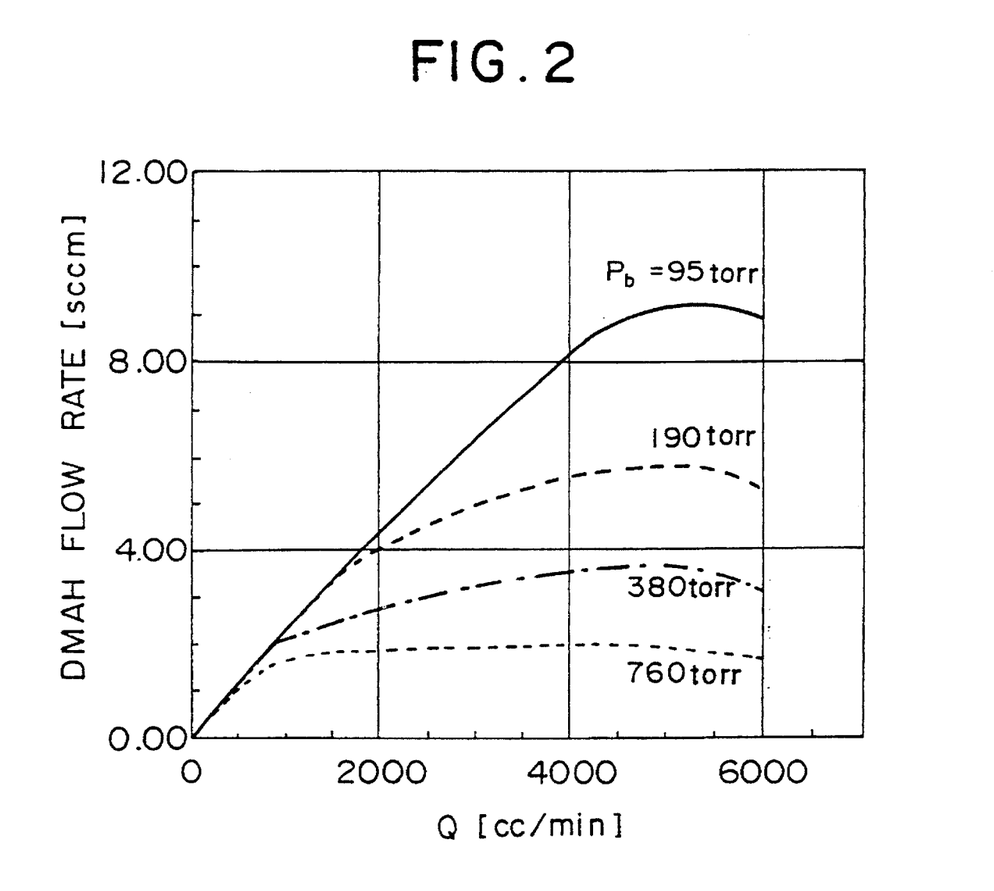
FIG. 2 is a graph showing the same relationship as that shown in FIG. 1, with the axis of abscissa representing the carrier gas flow rate $Q(H_2)$ converted into volumetric flow rate.

FIG. 2 represents the relationship shown in Fig. 1, with the carrier gas flow rate expressed in terms of the volumetric flow rate. The value of the carrier gas volumetric flow rate Q has been determined by approximation, on an assumption that the pressure inside the bubble is equal to the pressure within the bubbler. In the region where the carrier gas volumetric flow rate is small, the DMAH flow rate increases in proportion to the carrier gas volumetric flow rate in conformity with the theoretical relation expressed by the equation (3). However, when the carrier gas volumetric flow rate grows large, the proportional relationship is lost: more specifically, the vaporization rate is smaller than that expected from equation (3) at any level of the pressure within the bubbler. However, a tendency is observed that, as the pressure within the bubbler is lowered, the longer and closer the carrier gas volumetric flow rate remains to the proportional relationship as the carrier gas volumetric flow is increased. This means that a greater maximum DMAH flow rate is obtainable by reducing the pressure within the bubbler.

Figure 3:
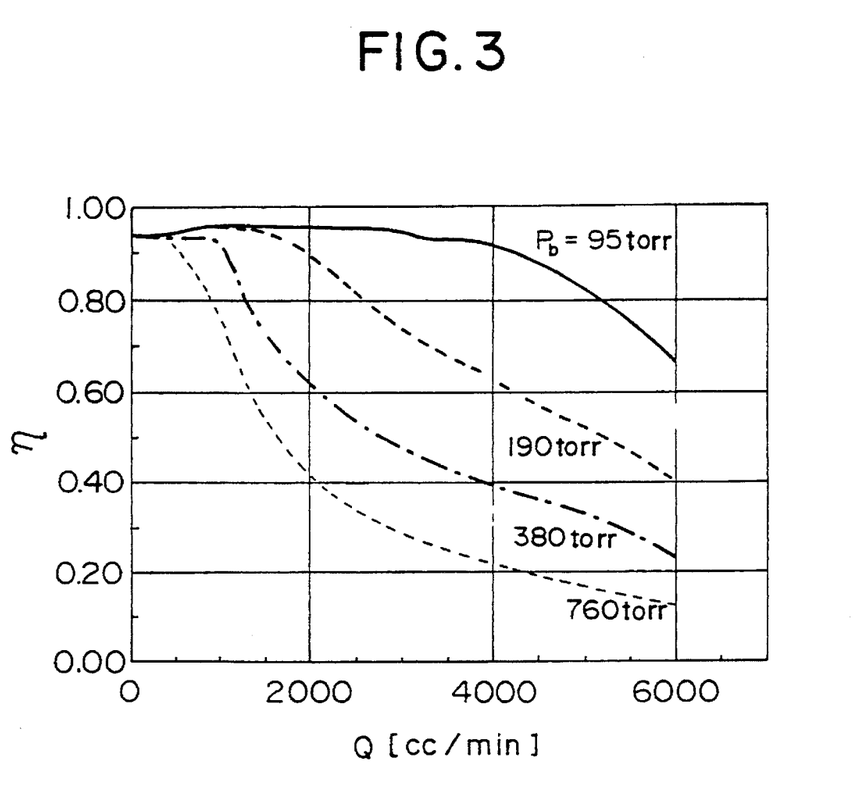
FIG. 3 is a graph showing the relationship between the volumetric flow rate $Q(H_2)$ of the carrier gas and vaporization efficiency.

The above-described tendency will be more clearly understood from FIG. 3, which shows a graph representing the relationship between the vaporization efficiency and the carrier gas volumetric flow rate. It will be seen from FIG. 3 that the tendency of the vaporization efficiency to decrease when the carrier gas flow rate is large is suppressed when the pressure within the bubbler is reduced.

In FIG. 3, η represents the vaporization efficiency which is given by the following equation:

$$\eta = \frac{F_{obs}}{F_{cal}} = \frac{F_{obs}}{Q \times P_{gs}/760}$$

wherein $F_{obs}$ represents measured flow rate of the material gas, $F_{cal}$ represents calculated flow rate and $P_{gs}$ represents the saturated pressure of the material gas.

Experiment 2

As explained above in connection with Experiment 1, the tendency of the vaporization efficiency to decrease when the carrier gas flow rate is large is suppressed when the pressure within the bubbler is reduced. In order to clarify the reason or cause of this fact, the inventors have conducted an experiment in which a glass bubbler was charged with DMAH and the state of generation of the bubbles was observed.

Figure 4A:
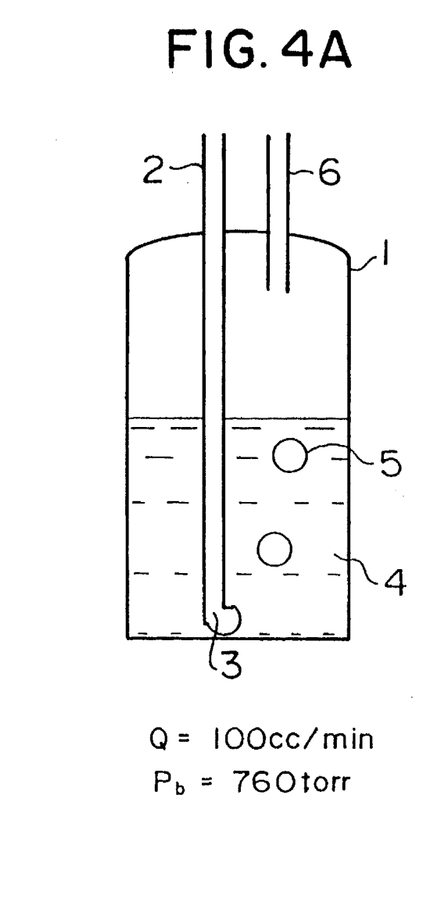
FIGS. 4A, 4B and 4C show schematic illustrations of various states in which bubbles are formed when $H_2$ gas is blown into DMAH at various pressures and flow rates.
Figure 4B:
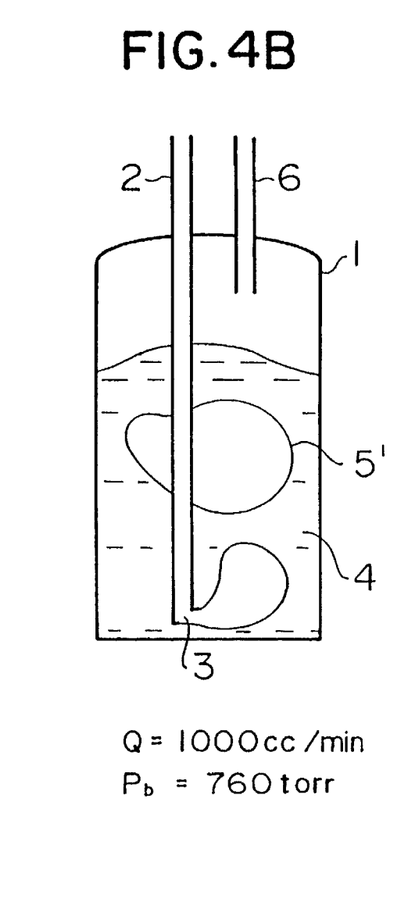
Figure 4C:
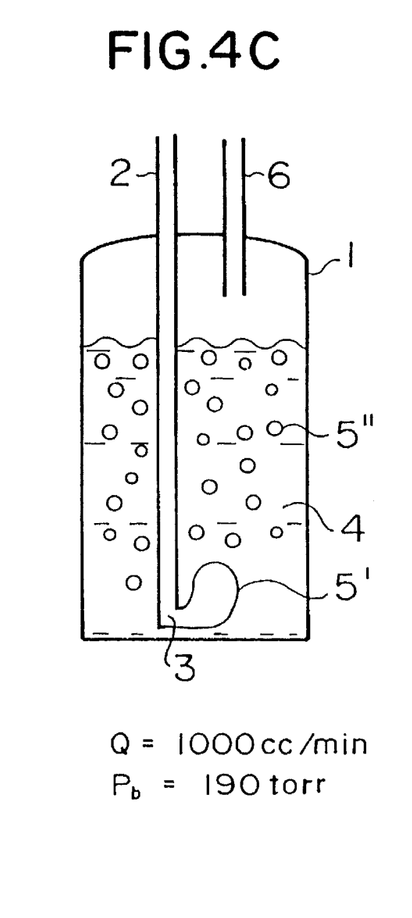

FIGS. 4A to 4C show typical forms of the bubbles. In these Figures, numeral 1 denotes a bubbler, 2 denotes a carrier gas introduction pipe, 3 denotes a gas blowing nozzle, 4 denotes the liquid material and 5 denotes bubbles. A pipe for taking out the material gas is denoted by 6. More specifically, FIG. 4A shows fine bubbles 5 which are generated in the highly viscous liquid 4 when the pressure within the bubbler 1 is 760 torr under the supply of the carrier gas at a volumetric flow rate of 100 cc/min, i.e., when a vaporization efficiency approximating 1 is observed in the graph shown in FIG. 3. In this case, the fine bubbles 5 were consecutively generated from the end of the nozzle at a substantially constant time interval. In contrast, when the carrier gas volumetric flow rate was increased to 1000 cc/min while the pressure within the bubbler was maintained at 760 torr, i.e., when the vaporization efficiency was reduced to about 0.75 as in FIG. 3, coarse bubbles 5' were formed as illustrated in Fig. 4B, indicating that the vaporization efficiency is reduced due to coarsening of the bubbles.

The internal pressure within the bubbler was reduced to 190 torr while the carrier gas volumetric flow rate was set to 1000 cc/min, which provides a vaporization efficiency approximating 1, as shown in FIG. 3. In this case, a large quantity of fine bubbles 5' were observed besides the coarse or large bubbles 5'. It was also observed that the whole liquid material was vigorously agitated. It is also understood that the average size of the coarse bubbles 5' is much smaller than that of the coarse bubbles shown in FIG. 4B which is obtained with the same volumetric flow rate of the carrier gas. This is attributable to the fact that the volume of the carrier gas trapped in the coarse bubbles 5' is decreased due to the generation of the large number of fine bubbles 5".

The fine bubbles 5" start to appear at locations spaced from the end of the nozzle 3, as shown in FIG. 4C, indicating that the carrier gas is first dissolved in the liquid material 4 and then released to form the fine bubbles 5". It is understood that the tendency of the vaporization efficiency to decrease is suppressed by virtue of the increase in the total bubble surface area brought about by the generation of the many fine bubbles 5".

A further increase in the carrier gas volumetric flow rate in the same bubbler caused an increase both in the rate of generation of fine bubbles 5" and the rate of generation of coarse bubbles 5'. However, when the carrier gas volumetric flow rate was increased beyond about 5500 cc/min, the coarse bubbles grew large enough to intermittently reach the liquid surface, while the rate of generation of fine bubbles 5" was reduced. This is considered to be attributable to the fact that the release of the carrier gas in the coarse bubbles 5' into the gaseous area above the liquid surface serves to reduce the pressure differential between the blowing pressure and the pressure within the bubbler $P_b$, thus reducing the rate of dissolution of the carrier gas into the liquid material. It is therefore understood that the reduction in the DMAH flow rate which is observed when the carrier gas flow rate is around 5500 cc/min under reduced pressures of 380 torr, 190 torr and 95 torr, as viewed in FIG. 2, is attributable to the reduction in the total bubble surface area caused by the reduction in the quantity of the fine bubbles 5", as explained above.

Figure 5:
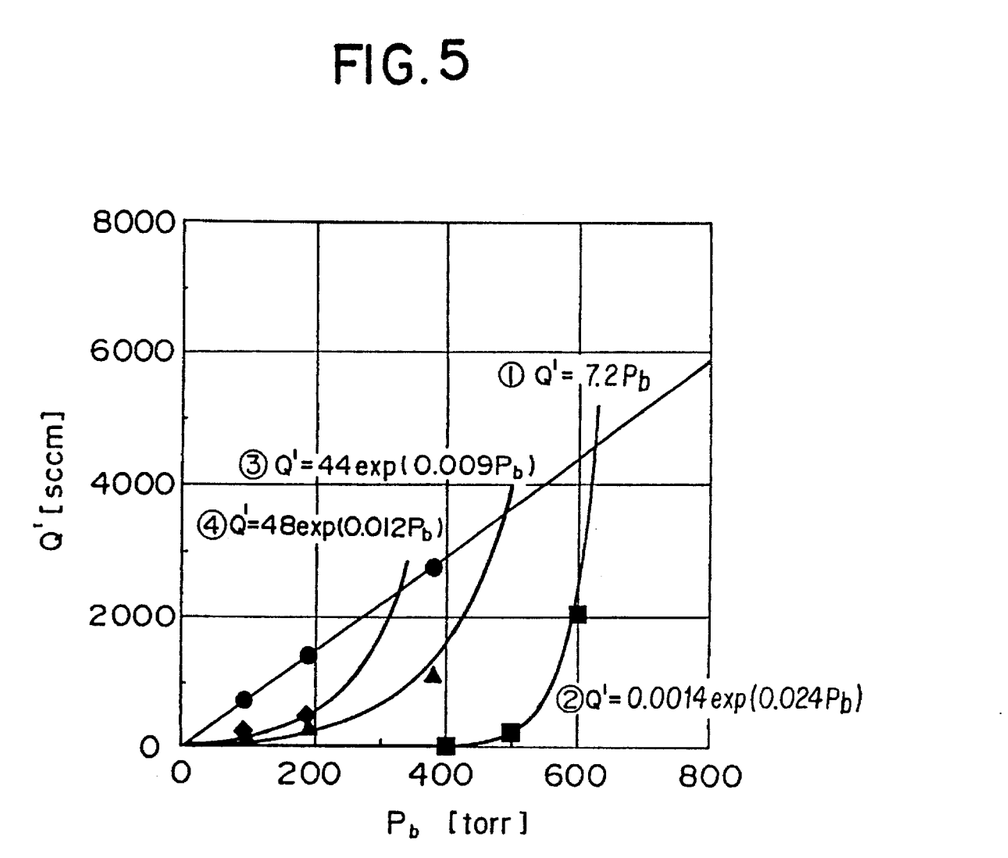
FIG. 5 is a diagram indicating preferred conditions of blowing $H_2$ gas into DMAH.

States of generation of bubbles were also observed under different pressures and carrier gas flow rates. As a result, it was confirmed that large rates of generation of fine bubbles 5" is obtained as in FIG. 4C specifically within a region between a straight line (1) $Q'=7.2\ P_b$ and a curve (2) $Q'=0.0014\ \exp(0.024\ P_b)$, as shown in FIG. 5. This region corresponds to the range in which, by virtue of generation of fine bubbles 5", appreciable suppression of the tendency for the vaporization efficiency to decrease is obtained.

When the carrier gas flow rate was zero, generation of fine bubbles 5" was observed when the pressure within the bubbler was reduced to 400 torr or below. From a theoretical point of view, generation of bubbles should not occur unless the pressure is reduced to the saturated vapor pressure of the liquid material, i.e., 1.7 torr. The generation of bubbles at the pressure of 400 torr or below is attributable to vaporization of $H_2$ which had previously been dissolved in the liquid material in the course of the experiment and remained in solution after the flow of the carrier gas was shut off.

When the carrier gas was supplied at a rate of 200 sccm, generation of fine bubbles 5" was observed when the pressure within the bubbler was reduced to 500 torr or less. This is considered to be attributable to the fact that the supply of the carrier gas caused the increase in the amount of $H_2$ dissolved in the liquid material, and as a result of this, pressure required to generate fine bubbles 5" increased. A further increase in the carrier gas flow rate gradually raised the pressure at which the generation of the fine bubbles 5" is maintained. The pressure at which the generation of fine bubbles 5" is maintained was increased to 600 torr when the carrier gas supply rate was increased to 2000 sccm. This effect is attributable to enhancement of generation of fine bubbles 5" due to cavitation caused by enhancement in the carrier gas supply rate, as well as re-dissolution of the carrier gas into the liquid material from temporarily-formed coarse bubbles 5'.

A region defined between a straight line (1) and a curve (3): $Q'=44\ \exp(0.009\ P_b)$ in FIG. 5 provides a region, in which the DMAH flow rate is 1.5 times or more than that (flow rate) obtained under atmospheric pressure within the bubbler and with the same carrier gas volumetric flow rate. Similarly, a region defined between the straight line (1) and a curve (4): $Q'=48\ \exp(0.012\ P_b)$ is determined as the region which provides the DMAH flow rate which is increased 2 times or greater.

In the experiment shown in FIG. 2, a number of fine bubbles decreased when the amount of flow rate of carrier gas was 5500 cc/min or more. But the magnitude of the flow rate varied in proportion to the height difference "h" (in cm) between the end of the nozzle and the surface of the liquid material. By putting into consideration the fact that in the experiment shown in FIG. 2, the "h" was 3.1 cm, the next equation is obtained:

$$Q=Q'760/P_b<5500\ h/3.1$$

Thus, the flow rate Q' is expressed by:

$$Q'<2.3\ hP_b$$

It is also possible to use a plurality of nozzles in combination with a bubbler having a greater volume. By supplying each nozzle with the carrier gas under conditions shown in FIG. 5, it is possible to increase the rate of supply of the material substantially in proportion to the number of the nozzles employed.

For the purpose of increasing the rate of supply of the material, it is also an effective measure to increase the saturated vapor pressure of the material by elevating the temperature of the material, up to a level that just avoids causing any appreciable thermal decomposition. In the case where DMAH was used as the liquid material, the rate of supply of the liquid material is increased 5 times by elevating the DMAH temperature from 22° C. to 50° C. under the same bubbling conditions.

The thin-film forming process was carried out by employing the described method of the invention for supplying a liquid material and using DMAH and $H_2$ as the liquid material and the carrier gas, respectively. The bubbler temperature was controlled to 22° C. The bubbling condition was selected to fall within the optimum range shown in FIG. 5: namely, the pressure within the bubbler was set to 95 torr and the carrier gas flow rate was set to 500 sccm (volumetric flow rate of 4000 sccm). Film formation was also conducted for the purpose of comparison, under a condition which falls within the range adopted in a known technique: namely, with the carrier gas flow rate of 500 sccm under the pressure within the bubbler of 760 torr. The supply rates of the DMAH gas were 8.2 sccm and 1.0 sccm, respectively, in the forming process in accordance with the invention and in the forming process executed under the condition of the known technique.

The film-forming process was carried out by using an ordinary reduced pressure CVD apparatus. Silicon wafers having a 6-inch diameter and a 8-inch diameter, coated with titanium nitride (TIN) film, were used as the substrates. The total pressure inside the CVD reaction vessel was maintained at 2 torr, while the substrate temperature was controlled to 280° C. The rates of deposition were measured to obtain the results as shown in Table 1.

TABLE 1

DEPOSITION RATES OF ALUMINUM

| $P_b$ [torr] | Q' [sccm] | Deposition rate (6-inch wafer) [nm/min] | Deposition rate (8-inch wafer) [nm/min] |
|---|---|---|---|
| 760 | 500 | 21 | 12 |
| 190 | 500 | 88 | 85 |

From Table 1 shown above, it will be understood that the known technique can provide only a low deposition rate, which is too small to be used in mass-production. In addition, the deposition rate was reduced by ~50% when the substrate size was increased from 6 inches to 8 inches. According to the calculation, about 80% of the supplied material has reached and been deposited on the substrate. It is clear that the too-small deposition rate obtained in the known art is caused by the insufficiency in the supply of the material.

In contrast, this invention provides a deposition rate which is more than 4 times greater than that provided by the known technique. The rate of deposition did not substantially decrease even when the substrate size was increased to 8 inches. Furthermore, the deposition rate could be increased up to 230 nm/min, by elevating the bubbler temperature to 50° C.

As will be understood from the foregoing description, according to the present invention, it is possible to increase the rate of supply of the material gas generated from liquid phase even when the liquid has high level of viscosity. This makes it possible to form a thin film at a high deposition rate on a substrate having a large area.

While the invention has been described in connection with the preferred embodiment, it will be understood that it is not intended to limit the invention to these embodiments. On the contrary, it is intended to cover all alternatives, modifications and equivalents as may be included within the spirit and scope of the invention as defined by the appended claims.

What is claimed is:

1. A method for forming a thin film comprising aluminum on a substrate by chemical vapor deposition, comprising the steps of:

pressurizing a bubbler to a pressure $P_b$ at most equal to atmospheric pressure, dimethyl aluminum hydride being provided in said bubbler;

supplying a carrier gas at a volumetric flow rate into said bubbler through at least one nozzle immersed in said dimethyl aluminum hydride;

maintaining the volumetric flow rate of the carrier gas and the pressure $F_b$ within said bubbler such that said carrier gas temporarily dissolves into said dimethyl aluminum hydride and is released from solution to form fine bubbles of carrier gas in said dimethyl aluminum hydride;

vaporizing said dimethyl aluminum hydride into said fine bubbles of carrier gas;

introducing the dimethyl aluminum hydride gas together with said carrier gas into a CVD reaction vessel containing said substrate; and depositing aluminum onto the substrate to form the thin film.

2. A method for forming a thin film of at least a first material on a substrate by chemical vapor deposition using a viscous liquid material provided in a bubbler, the method comprising the steps of:

supplying a carrier gas at a volumetric flow rate into the bubbler through at least one nozzle immersed in the viscous liquid material;

controlling the volumetric flow rate of the carrier gas into the bubbler and a pressure $P_b$ within the bubbler, the pressure $P_b$ being below atmospheric pressure;

dissolving the carrier gas into the viscous liquid material, the viscous liquid material having a viscosity of at least 100 cp and including an least the first material;

vaporizing the viscous liquid material into bubbles of the carrier gas;

introducing the vaporized viscous liquid material as a gas together with the carrier gas into a CVD reaction vessel containing the substrate; and depositing at least the first material onto the substrate to form the thin film, wherein the viscous liquid material is dimethyl aluminum hydride, the pressure $P_b$, and the volumetric flow rate of the carrier gas per nozzle, Q', being selected to meet the following condition:

$$0.0014 \, exp(0.024 \, P_b) < Q' < 2.3 \, hP_b$$

where h represents a height difference between an outlet end of each of the at least one nozzle and surface of the viscous liquid material in the bubbler.

3. The method of claim 2, wherein the viscosity of the viscous liquid material is at least 4000 cp.

4. The method of claim 2, wherein the pressure within the bubbler is maintained at the pressure $P_b$ at most equal to 380 torr.

5. The method of claim 2, wherein the pressure within the bubbler is maintained at the pressure $P_b$ at most equal to 190 torr.

6. The method of claim 2, wherein the pressure within the bubbler is maintained at the pressure $P_b$ at most equal to 95 torr.

7. A method for forming a thin film of at least a first material on a substrate by chemical vapor deposition using a viscous liquid material provided in a bubbler, the method comprising the steps of:

supplying a carrier gas at a volumetric flow rate into the bubbler through at least one nozzle immersed in the viscous liquid material;

controlling the volumetric flow rate of the carrier gas into the bubbler and a pressure $P_b$ within the bubbler, the pressure $P_b$ being below atmospheric pressure;

dissolving the carrier gas into the viscous liquid material, the viscous liquid material having a viscosity of at least 100 cp and including at least the first material;

vaporizing the viscous liquid material into bubbles of the carrier gas;

introducing the vaporized viscous liquid material as a gas together with the carrier gas into a CVD reaction vessel containing the substrate; and depositing at least the first material onto the substrate to form the thin film, wherein the viscous liquid material is dimethyl aluminum hydride, the pressure $P_b$, and the volumetric flow rate of the carrier gas per nozzle, Q', being selected to meet the following condition:

$$44 \, exp(0.009 \, P_b) < Q' < 2.3 \, hP_b$$

where h represents a height difference between an outlet end of each of the at least one nozzle and surface of the viscous liquid material in the bubbler.

8. The method of claim 7, wherein the viscosity of the viscous liquid material is at least 4000 cp.

9. The method of claim 7, wherein the pressure within the bubbler is maintained at the pressure Pb at most equal to 380 torr.

10. The method of claim 7, wherein the pressure within the bubbler is maintained at the pressure $P_b$ at most equal to 190 torr.

11. The method of claim 7, wherein the pressure within the bubbler is maintained at the pressure $P_b$ at most equal to 95 torr.

12. A method for forming a thin film of at least a first material on a substrate by chemical vapor deposition using a viscous liquid material provided in a bubbler, the method comprising the steps of:

supplying a carrier gas at a volumetric flow rate into the bubbler through at least one nozzle immersed in the viscous liquid material;

controlling the volumetric flow rate of the carrier gas into the bubbler and a pressure $P_b$ within the bubbler, the pressure $P_b$ being below atmospheric pressure;

dissolving the carrier gas into the viscous liquid material, the viscous liquid material having a viscosity of at least 100 cp and including at least the first material;

vaporizing the viscous liquid material into bubbles of the carrier gas;

introducing the vaporized viscous liquid material as a gas together with the carrier gas into a CVD reaction vessel containing the substrate; and depositing at least the first material onto the substrate to form the thin film, wherein the viscous liquid material is dimethyl aluminum hydride, the pressure $P_b$ and the volumetric flow rate of the carrier gas per nozzle, Q', being selected to meet the following condition:

$$48\ exp(0.12\ P_b) < Q'' < 2.3\ hP_b$$

where h represents a height difference between an outlet end of each of the at least one nozzle and surface of the viscous liquid material in the bubbler.

13. The method of claim 12, wherein the viscosity of the viscous liquid material is at least 4000 cp.

14. The method of claim 12, wherein the pressure within the bubbler is maintained at the pressure $P_b$ at most equal to 380 torr.

15. The method of claim 12, wherein the pressure within the bubbler is maintained at the pressure $P_b$ at most equal to 190 torr.

16. The method of claim 12, wherein the pressure within the bubbler is maintained at the pressure $P_b$ at most equal to 95 torr.

* * * * *